United States Patent [19]

Sakai et al.

[11] 4,355,374

[45] Oct. 19, 1982

[54] SEMICONDUCTOR MEMORY DEVICE

[75] Inventors: Yoshio Sakai, Hachioji; Mitsumasa Koyanagi, Kokubunji; Hideo Sunami, Hinodemachi; Norikazu Hashimoto, Hachioji, all of Japan

[73] Assignee: Hitachi, Ltd., Tokyo, Japan

[21] Appl. No.: 172,378

[22] Filed: Jul. 24, 1980

[30] Foreign Application Priority Data

Aug. 1, 1979 [JP] Japan .................................. 54/97301

[51] Int. Cl.³ ....................... G11C 11/40; G11C 11/24
[52] U.S. Cl. ..................................... 365/149; 365/174
[58] Field of Search ............... 365/149, 174, 177, 182, 365/184, 185

[56] References Cited

U.S. PATENT DOCUMENTS 4,164,751  8/1979  Tasch, Jr. ............................. 365/149

Primary Examiner—Terrell W. Fears
Attorney, Agent, or Firm—Antonelli, Terry & Wands

[57] ABSTRACT

A semiconductor memory comprising a memory cell disposed on a p-type semiconductor substrate and including an insulated-gate field effect transistor and a storage capacitor. The storage capacitor comprises: an insulator capacitor including a first electrode disposed on the substrate, a film of $Si_3N_4$ disposed on the first electrode, and a second electrode disposed on the $Si_3N_4$ film; and a pn junction capacitor including a first n-type impurity region for constituting either the source or drain of the insulated-gate field effect transistor, and a second p-type impurity region disposed in contact with the first impurity region and having a higher impurity concentration than the substrate.

8 Claims, 29 Drawing Figures

SEMICONDUCTOR MEMORY DEVICE

BACKGROUND OF THE INVENTION

1. Field of the Invention

This invention relates to a semiconductor memory device, particularly to a dynamic memory device including a storage capacitor and a switching transistor. More particularly, this invention relates to a dynamic type MOS random access memory device (which will be shortly referred to as "MOS·RAM") including an insulated-gate field effect transistor (which will also be shortly referred to as "MOS transistor") as the switching transistor.

2. Description of the Prior Art

As the MOS·RAM, there have been proposed a variety of modes including the minimum one-transistor type. In the conventional one-transistor type MOS·RAM, as shown in FIG. 1, a memory cell composed of an insulated-gate field effect switching transistor (which will be shortly referred to as "MOS transistor") 1 and a storage capacitor 2 for storing information is addressed by a word line made of an electrode of Al and by a data line made of a diffusion layer 4. Here: reference numeral 5 indicates an Si substrate; 6 an insulating layer (of $SiO_2$ or the like) for isolating different elements from each other; 7 a gate insulating film (of $SiO_2$, $Al_2O_3$, $Si_3N_4$ or the like); 8 a storage-gate electrode of a first level polycrystalline silicon layer; 9 an inter-layer insulating film (of $SiO_2$ or the like); 10 a diffusion layer for constituting a source or drain together with the aforementioned diffusion layer 4; 11 an inversion layer which is formed by impressing a voltage upon the polycrystalline silicon electrode 8; and 12 a polycrystalline silicon electrode (or gate electrode). The aforementioned storage capacitor 2 includes an MIS (Metal-Insulator-Semiconductor) capacitor which is established between the polycrystalline silicon electrode 8 and the inversion layer 12.

As seen from FIG. 1, the storage capacitor 2 for storing information is two-dimentionally arranged on one plane together with the switching transistor 1 so that the memory cell has a large area. In the one-MOS transistor type RAM, the charge stored in the storage capacitor is proportional to the signals voltage, which is desired to be high for the circuit considered. In order to elongate the charge hold time thereby to ensure the stable operation of the circuit, therefore, the storage capacitance is also desired to be high. In order to increase the storage capacitance, however, the area of a capacitor portion has to be enlarged reducing the integration density.

In Japanese Laid-Open Patent Publication No. 53-4483 or U.S. Pat. No. 4,151,607, we have proposed a memory cell which is so constructed that the capacitor portions for storing the charge are stacked one on another so that the elements are positively utilized in the longitudinal direction thereof thereby to increase the integration density and accordingly the storage capacitance. FIG. 2 sectionally shows the construction of the one-MOS transistor RAM (which will be shortly referred to as "STC (Stacked Capacitor Structure) memory") using the stacked capacitor. As shown in FIG. 2, an inter-layer insulating film 14 for constituting the capacitor is mounted on the first level electrode (or, in this example, a voltage applying electrode for forming the inversion layer 11) 8 which is formed on the region (which resorts, in this example, to the inversion layer althrough the region of the opposite conductivity may be made of an impurity layer) 11 positioned adjacent to the diffusion layer 10 constituting the source or drain of the insulated-gate field effect switching transistor 1 while exhibiting the opposite conductivity to that of the substrate 5. Then, a second electrode 15 is mounted thereon such that its one end is connected with the diffusion layer 10.

After that, the inter-layer insulating film 9 and the Al electrode 3 providing the work line are mounted in a similar manner to the prior art.

Thus, the two electrodes 8 and 15 constitute an insulator capacitor $C_I$ through the inter-layer insulating film 14. The storage capacitance of the capacitor 2 is expressed by $\overline{C}_I + \overline{C}_{OX} + \overline{C}_D$. Here, letters $C_{OX}$ indicate the MIS capacitor which is constituted between the inversion layer 11 and the electrode 8 through an oxide film 7b, whereas letters $C_D$ indicate the depletion layer capacitor which is constituted between the inversion layer 11 and the substrate 5 through the depletion layer.

In other words, the memory cell can have its storage capacitance increased by the capacitance $C_I$ in comparison with the conventional value of $\overline{C}_{OX} + \overline{C}_D$ by resorting to the construction that the electrode 15 is mounted through the insulating film 14 upon the electrode 8, as shown in FIG. 2. As a result, in case the same storage capacitance as that of the conventional memory cell is used, the area of the memory cell can be remarkably decreased.

In the STC memory thus constructed, the insulating film 14 constituting the storage capacitor can be arbitrarily addressed by stacking the capacitor portion upon the element with the resultant advantage that the film of $Si_3N_4$ having high permitivity can be used.

In this STC memory, however, in case a thin film of $Si_3N_4$ is used as the insulating film 14 with a view to increasing the storage capacitance, there is a limit to the increase in the storage capacitance due to the problem of a leakage current or the like. Moreover, since the diffusion layer 10 connected with one electrode of the storage capacitor is positioned to directly contact with the substrate 5 of low impurity concentration, extinction of the charge takes place due to the noises including a radioactive ray, thus causing a memory operation error which will influence the MIS capacitor $C_{OX}$ and the depletion layer capacitor $C_D$.

As an improvement over the one-transistor type MOS·RAM shown in FIG. 1, on the other hand, there has also been proposed a buried capacitor type memory which is disclosed in Japanese Laid-Open Patent Publication No. 53-34435. The buried capacitor type memory disclosed resorts to the pn junction capacitor between a diffusion layer 13 constituting the source or drain of the insulated-gate field effect transistor 1 and a region 16 which is formed thereunder and which has the same conductivity type but a higher impurity concentration than the substrate 5, as shown in FIG. 3. The buried capacitor type memory thus disclosed has such a construction that the storage capacitor is buried in the substrate and provides a memory cell having a smaller area without any requirement for the multiple-layer interconnection technique because the electrode 8 is not used as contrary to the storage gate structure of the memory shown in FIG. 1.

In the buried capacitor type memory disclosed, however, the increase in the capacitance is restricted by the leakage current through and the breakdown voltage at the pn junction. Moreover, since the capacitance of the pn junction per unit area is lower than that of an oxide film or the like, the larger area is required for the higher storage capacitance, thus inviting a disadvantage in the integration density.

SUMMARY OF THE INVENTION

It is therefore an object of this invention to provide a structure which can increase both the integration density and the storage capacitance of the memory cell of a dynamic MOS·RAM to higher levels than those of the memory cell of a conventional dynamic MOS·RAM and which can preclude the extinction of a storage current due to a radioactive ray such as an alpha-ray.

Particularly, an object of this invention is to provide a semiconductor memory which has a high storage capacitance with reduction in the area of the memory cell while being free from the extinction of the storage charge due to the radioactive ray.

The memory cell constituting the dynamic MOS·-RAM of this invention is of the type, which is equipped with both the insulator capacitor shown in FIG. 2 and the pn junction capacitor shown in FIG. 3, which is so constructed that it can increase the storage capacitance and improve the integration density without any difficulty and which can preclude such extinction of the signal charge due to the radioactive ray as raises a problem in the conventional capacitor having the inversion layer.

According to this invention, there is provided a semiconductor memory comprising a memory cell disposed on a semiconductor substrate of first conduction type and including an insulated-gate field effect transistor and a storage capacitor, wherein the improvement resides in that said storage capacitor comprises: an insulator capacitor including a first electrode disposed on said substrate, an insulating film disposed on the first-named electrode for providing a dielectric, and a second electrode disposed on said insulating film; and a pn junction capacitor including a first impurity region of second conduction type for constituting one of the source and drain of said insulated-gate field effect transistor, and a second impurity region of first conduction type disposed in contact with the first-named impurity region and having a higher impurity concentration than said substrate.

DESCRIPTION OF THE PREFERRED EMBODIMENTS

This invention will now be described in more detail in connection with the embodiments thereof.

EXAMPLE 1

Figure 4A:
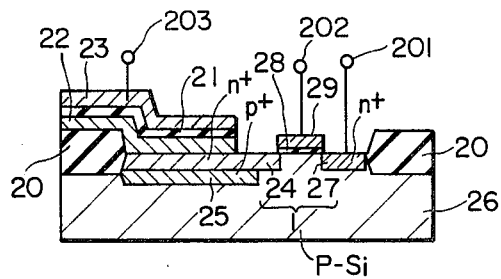
FIGS. 4A and 4B are a sectional view showing the construction of a memory cell according to a first embodiment of a MOS·RAM of this invention and a diagram showing an equivalent circuit, respectively.
Figure 4B:
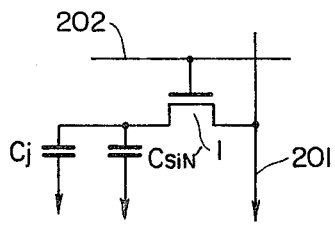

FIGS. 4A and 4B are a sectional view showing a first embodiment of the memory cell of a one-transistor type MOS·RAM according to this invention and a diagram showing an equivalent circuit, respectively.

In the memory cell shown in FIGS. 4A and 4B, a storage capacitor $C_S$ is composed of two capacitors. One of these is an insulator capacitor $C_{SiN}$ which is prepared by sandwiching an insulating film 21 such as a nitride ($Si_3N$) film or an alumina ($A_2O_3$) film having high permitivity between a first layer 22 of polycrystalline silicon and a second layer 23 of polycrystalline silicon. The other is a pn junction capacitor of impurity layers 24 and 25 of n+- and p+-type conductivities, which are formed in an Si substrate 26 of p-type conductivity. In the memory cell of FIGS. 4A and 4B, moreover, the addressing MOS transistor 1 is composed of the n+-type layers 24 and 27, a gate insulating film 28 and a gate electrode 29 of a third layer of polycrystalline silicon. In FIGS. 4A and 4B, incidentally, reference numerals 201, 202 and 203 indicate a data line, a word line and a line, through which a DC bias voltage (e.g., a preset positive voltage $V_{CC}$ or a ground potential $V_S$) is fed to the electrode 23. The two capacitors $C_{SiN}$ and $C_j$ thus constructed are connected in parallel with the addressing MOS transistor 1, as shown in the equivalent circuit of the MOS·RAM memory cell of FIG. 4B so that the storage capacitance $\bar{C}_S$ of the memory cell as a whole becomes the sum of $\bar{C}_{SiN}$ and $\bar{C}_j$. In this way, since those two capacitors $C_{SiN}$ and $C_j$ are stacked one on the other at the same place, a high storage capacitance can be attained with a reduced area.

Since, moreover, the n+-type layer 24 contacting with the electrode 22 at one side of the storage capacitor is substantially covered with the p+-type layer 25, a potential barrier is established between the n+-type layer and the low doped p-type substrate 26. As a result, even if any charge generated by the noises such as a radioactive ray goes into the memory cell portion, it is prevented from further going into the n+-type layer of the capacitor portion by the existence of that potential barrier so that the noise immunity can be increased.

If the MOS-RAMs of FIGS. 1, 2, 3 and 4A are compared with the cell area of 60 μm² and with the addressing MOS transistors having the same construction, the storage capacitances are determined in the following manners.

Figure 1:
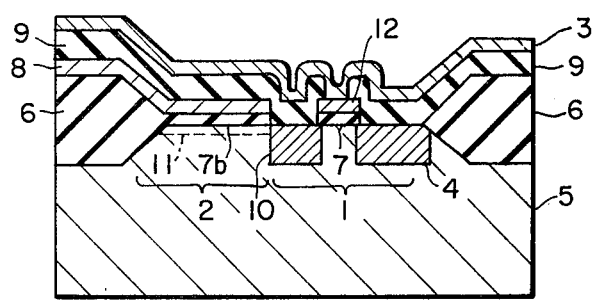
FIG. 1 is a sectional view showing the construction of a one-transistor type MOS·RAM according to the prior art.
Figure 2:
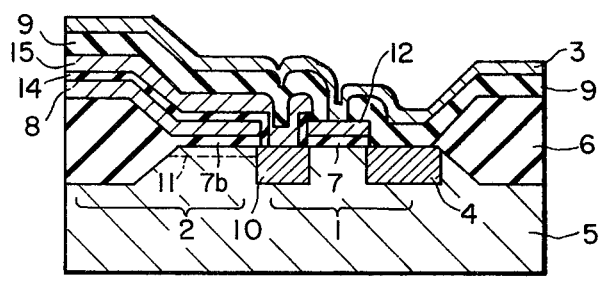
FIG. 2 is a sectional view showing the construction of an STC memory according to the prior art.
Figure 3:
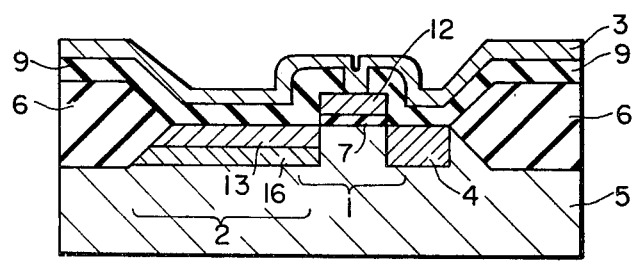
FIG. 3 is a sectional view showing the construction of a buried capacitor type memory according to the prior art.

(1) MOS-RAM of FIG. 1
Conditions:
(i) Film thickness of the SiO₂ film $7b=35$ nm; and
(ii) Sheet resistance of the polycrystalline Si layer $8=40$ Ω/sq.
Storage capacitance:
$\overline{C}_S = \overline{C}_{OX} = 100 \times 10^{-4}$ PF/bit (2) MOS-RAM of FIG. 2
Conditions:
(i) and (ii) Identical to those of the above (1)
(iii) Film thickness $T_{SiN}$ of the insulating (Si₃N₄) film $14=35$ nm
Storage capacitance:
$\overline{C}_S = \overline{C}_{SiN} + \overline{C}_{OX} = 250 \times 10^{-4}$ PF/bit (3) MOS-RAM of FIG. 3
Conditions:
(i) Impurity concentration of N+-type layer $13 = 10^{19}$ to $10^{20}$ cm$^{-3}$; and
(ii) Impurity concentration of p+-type layer $16 = 8 \times 10^{16}$ cm$^{-3}$
Storage Capacitance:
$\overline{C}_S = \overline{C}_j = 50 \times 10^{-4}$ PF/bit (4) MOS-RAM (of this invention) of FIG. 4A
Conditions:
(i) Film thickness $T_{SiN}$ of the Si₃N₄ film $21=35$ nm;
(ii) Impurity concentration of n+-type layer $24 = 10^{19}$ to $10^{20}$ cm$^{-3}$; and
(iii) Impurity concentration of p+-type layer $25 = 8 \times 10^{16}$ cm$^{-3}$
Storage Capacitance:
$\overline{C}_S = \overline{C}_{SiN} + \overline{C}_j = 450 \times 10^{-4}$ PF/bit In the respective MOS-RAMs thus far described, the addressing MOS transistor 1 is composed of the source and drain regions 24 and 27 (or 10 and 4) of the n+-type, which are formed in the surface region of the p-type Si substrate (having the impurity concentration of $5 \times 10^{14}$ cm$^{-3}$) and which has the depth of 0.3μm and the impurity concentration of $10^{20}$ to $10^{21}$ cm$^{-3}$, the SiO₂ film (or the gate insulating film) 28 (or 7) having the thickness of 35 nm and the gate electrode 29 (or 12) of polycrystalline silicon having the sheet resistance of 30 Ω/sq.

EXAMPLE 2

Figure 5A:
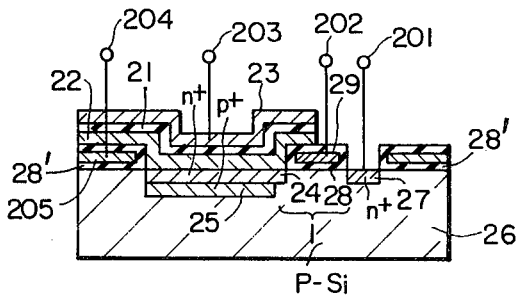
FIGS. 5A and 5B are a sectional view showing the construction of a memory cell according to a second embodiment of a MOS·RAM of this invention and a diagram showing an equivalent circuit, respectively.
Figure 5B:
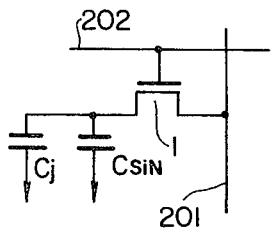

FIGS. 5A and 5B are a sectional view showing a second embodiment of the memory cell of the MOS-RAM of this invention and a diagram showing an equivalent circuit, respectively.

Similarly to the embodiment shown in FIGS. 4A and 4B, the storage capacitor $C_S$ according to the embodiment of FIGS. 5A and 5B is also composed of the insulator capacitor $C_{SiN}$ and the pn junction capacitor $C_j$. In this second embodiment, the insulator capacitor $C_{SiN}$ having its Si₃N₄ sandwiched between the polycrystalline silicon layers 22 and 23 is formed to extend over the gate electrode 29. As a result, the area of the insulator capacitor portion is increased so that its capacitance $\overline{C}_{SiN}$ is accordingly increased. On the other hand, the pn junction capacitance $\overline{C}_j$ between the n+-type layer 24 and the p+-type layer 25, which are formed in the silicon substrate 26, is the same as that of the embodiment shown in FIGS. 4A and 4B. In the memory cell according to the second embodiment, therefore, the overall storage capacitance $\overline{C}_S$ can be increased while retaining the high integration density. Under the same condition as that (4) of Example 1, $\overline{C}_S = 650 \times 10^{-4}$ PF/bit.

Incidentally, reference numerals 204 and 205 indicate a biasing electrode (of polycrystalline Si) for element isolation and a terminal for applying the ground potential.

In the memory cell shown in FIG. 5A, moreover, the gate electrode 29 is made of the first layer of polycrystalline Si whereas the electrodes 22 and 23 are made of the second and third layers of polycrystalline Si.

EXAMPLE 3

Figure 6A:
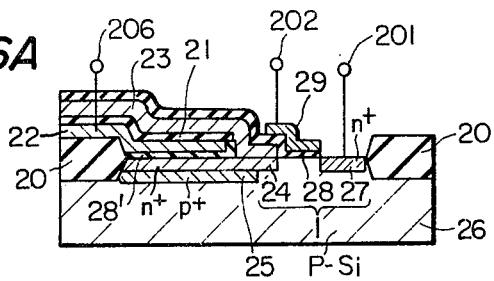
FIGS. 6A and 6B are a sectional view showing the construction of a memory cell according to a third embodiment of a MOS·RAM of this invention and a diagram showing an equivalent circuit, respectively.
Figure 6B:
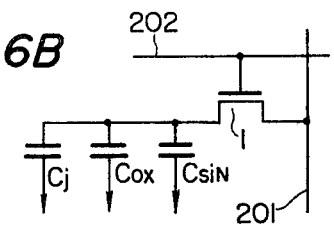

FIGS. 6A and 6B are a sectional view showing a third embodiment of the memory cell of the MOS-RAM of this invention and a diagram showing an equivalent circuit.

The storage capacitor of the memory cell of this third embodiment is composed of three capacitors. More particularly, the first capacitor is the capacitor $C_{SiN}$ which is prepared by sandwiching the insulating film 21 such as the nitride or alumina film between the first polycrystalline silicon layer 22 and the second polycrystalline silicon layer 23. The second capacitor is the capacitor $C_{OX}$ which is prepared by sandwiching an oxide film 28' between the first polycrystalline silicon layer 22 and the n+-type layer 24 in the silicon substrate 26. Moreover, the third capacitor is the capacitor $C_j$ which is made of the junction between of the n+-type layer 24 and the p+-type layer 25, which are formed in the silicon substrate 26. Those three capacitors are stacked one on another at the same place so that the high storage capacitance $\overline{C}_S$ can be obtained with the small area. The value of the storage capacitance $\overline{C}_S$ assumes 3.5 to 4 times that of the conventional memory cell shown in FIG. 1, which has the same area while being composed only of the MIS capacitor.

Incidentally, reference numeral 206 indicates a line through which the polycrystalline Si electrode 22 is set at the ground potential.

EXAMPLE 4

Figure 7A:
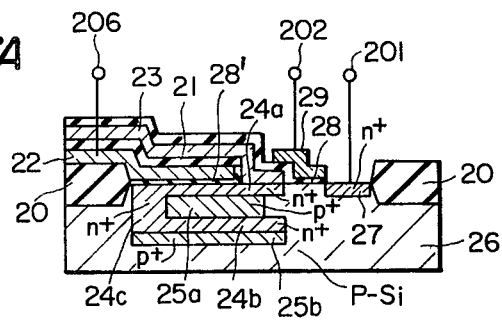
FIGS. 7A and 7B are a sectional view showing the construction of a memory cell according to a fourth embodiment of a MOS·RAM of this invention and a diagram showing an equivalent circuit, respectively.
Figure 7B:
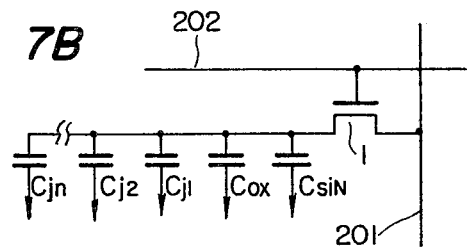

FIGS. 7A and 7B are a sectional view showing a fourth embodiment of the memory cell of the MOS-RAM of this invention and a diagram showing an equivalent circuit.

The memory cell according to the fourth embodiment has such a construction as ensure the highest storage capacitance of all the embodiments. The major feature making the present memory cell more excellent than the foregoing ones resides in that the n+-P+ junctions to be formed in the silicon substrate are stacked in multiple stages so that the sum of the pn junction capacitances can contribute to the storage capacitance $\overline{C}_S$. As a result, the capacitance of the insulating film is added to the summed capacitance so that a remarkably high storage capacitance can be realized. The construction according to the fourth embodiment can be applied to all the aforementioned various memory cells. The construction shown in FIG. 7A corresponds to the case, in which the construction of the fourth embodiment is applied to the memory cell shown in FIG. 6A so that the storage capacitor $C_S$ is composed of at least five capacitors. More particularly, the first capacitor is the capacitor $C_{SiN}$ which is prepared by sandwiching the insulating film 21 such as the nitride or alumina film between the first polycrystalline silicon layer 22 and the second polycrystalline silicon layer 23. The second capacitor is the capacitor $C_{OX}$ which is prepared by sandwiching the oxide film 28' between the first polycrystalline silicon layer 22 and an n+-type layer 24a in the silicon substrate 26. The third capacitor is the pn junction capacitor $C_{j1}$ between the n+-type layer 24a and a p+-type layer 25a. The fourth capacitor is the pn junction capacitor $C_{j2}$ between the p+-type layer 25a and an n+-type layer 24b. The fifth capacitor is the depletion layer capacitor $C_{j3}$ between the n+-type layer 24b and a p+-type layer 25b. The number of the stages of the pn junction capacitor can be increased within the allowable range of the production process. The respective n+-type layers are connected through an N+-type layer 24C having a large diffusion depth so that all the depletion layer capacitors are connected in parallel. As a result, the memory cell according to the present construction can have its storage capacitance $\overline{C}_S$ as high as 5 to 10 times that of the conventional memory cell shown in FIG. 1.

EXAMPLE 5

Figure 8:
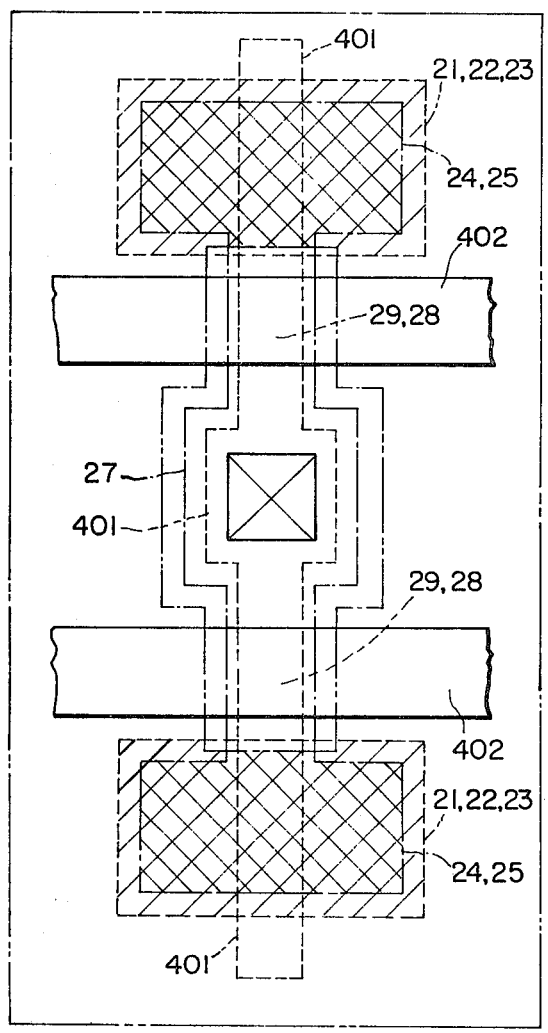
FIG. 8 is a top plan view showing one example of the layout pattern of the memory cell of FIG. 4A.

The plane construction of the memory cell of the MOS·RAM according to this invention will be described in the following. FIG. 8 shows one of the design examples of the memory cell according to this invention by way of the memory cell shown in FIG. 4A. The storage capacitor portion is shown as a hatched region, in which the capacitor with a high permitivity insulator and the pn junction capacitor are stacked one on the other. According to the present design example, therefore, the storage capacitance of the memory cell can be as high as 4 to 5 times that of the conventional memory cell composed only of the MIS capacitor while having the same area so that the operations of the high capacitance MOS·RAM can be stabilized.

EXAMPLE 6

Figure 9A:
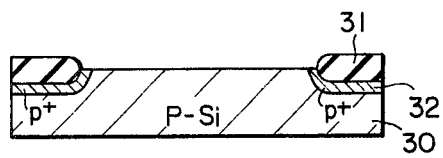
FIGS. 9A, 9B, 9C, 9D, 9E, 9F and 9G are sectional views illustrating one example of the steps for producing the memory cell of FIG. 4A.
Figure 9B:
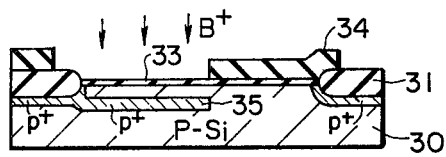
Figure 9C:
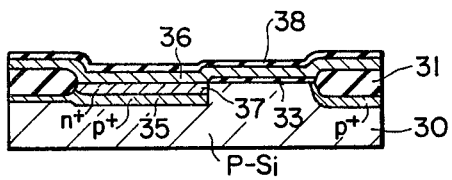
Figure 9D:
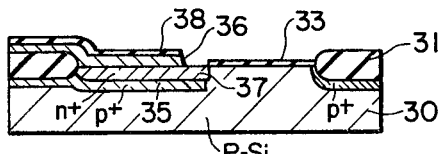
Figure 9E:
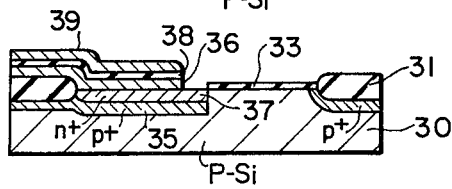
Figure 9F:
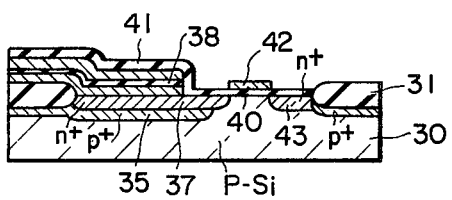
Figure 9G:
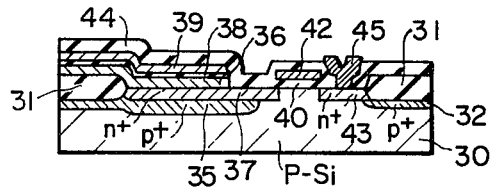
Figure 10:
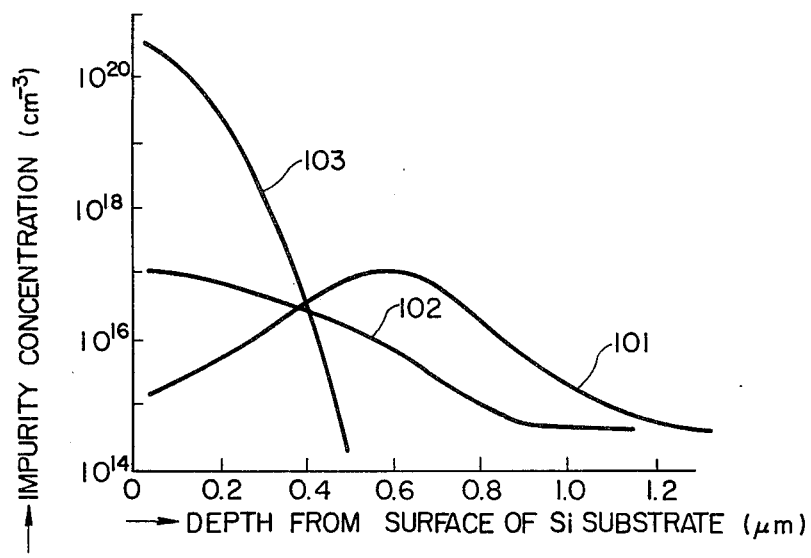
FIG. 10 is a graphical presentation illustrating the concentration distribution of the impurity layer constituting the pn junction capacitor of the memory cell of FIG. 4.
Figure 11:
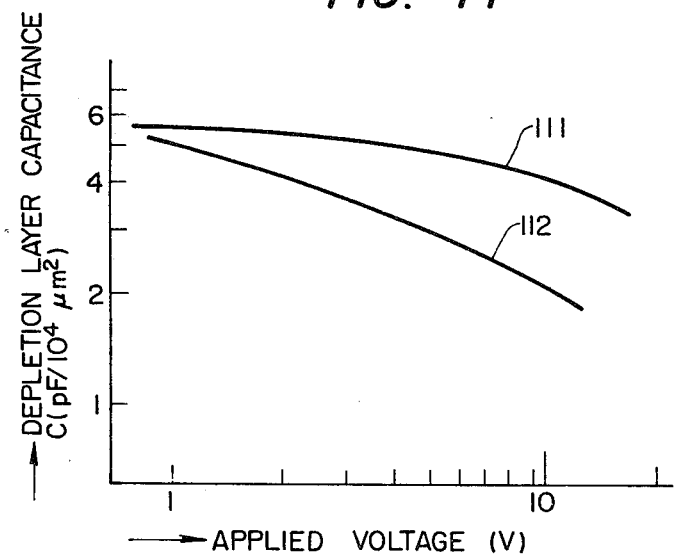
FIG. 11 is a graphical presentation illustrating the difference in the dependency upon an applied voltage between a pn junction capacitance due to the difference in the impurity concentration distribution.

The process for producing the memory cell according to this invention will be described hereinafter. The description is directed to the cases in which the n+-p+ junction to be established in the silicon substrate is of one and multiple step types. FIGS. 9A to 9G illustrate the production process of the memory cell which is constructed, as shown in FIG. 4A, to have one step of the n+-p+ type junction. A low doped silicon substrate 30 of p-type conductivity is oxidized by the local oxidization process to form a field oxidization film (of $SiO_2$) 31 having a thickness of 0.5 to 1 μm and a channel stopper layer 32 of p+-type conductivity (as shown in FIG. 9A). Then, an oxide film (of $SiO_2$) 33 of a small thickness of 30 to 50 nm is formed on the surface of the silicon substrate 30. After that, the oxide film 33 is masked with a photoresist film 34, and boron ions B+ are implanted with a concentration of 1 to $3 \times 10^{12}$ cm$^{-2}$ into the silicon substrate 30 by the high energy of 150 to 400 KeV thereby to form a p+-type layer 35 (as shown in FIG. 9B). Then, after the thin oxide film (of $SiO_2$) is etched by using the photoresist film 34 as the mask, the photoresist film 34 is removed, and a first polycrystalline silicon layer 36 doped with an n-type impurity of high concentration is deposited to have a thickness of 0.1 to 0.3 μm. Then, an insulating film of high permittivity having a thickness of 20 to 50 nm, e.g., a thin nitride or alumina film 38 is deposited upon the polycrystalline silicon. In this instance, the n-type impurity in the polycrystalline silicon diffuses into the silicon substrate at the region, in which the polycrystalline silicon 36 and the silicon substrate 30 directly contact, thereby to form an n+-type layer 37 (as shown in FIG. 9C). Then, the insulating film 38 and the polycrystalline silicon 36 are simultaneously etched by the plasma etching process (as shown in FIG. 9D). After that, a second polycrystalline silicon layer 39 having a highly doped n-type impurity is deposited to have a thickness of 0.2 to 0.4 μm, and a pattern is formed to cover the insulating film 38 by the photoetching process (as shown in FIG. 9E). Then, the thin oxide film (of $SiO_2$) 33 is removed, and oxidation is effected at a temperature of 800° to 1000° C. to form a thin gate oxide film (of $SiO_2$) 40 having a thickness of 20 to 50 nm. Since, in this instance, the second polycrystalline silicon layer is highly doped with the n-type impurity, a thick oxide film (of $SiO_2$) 41 of a thickness of 100 to 200 nm is formed. After that, a gate electrode 42 is made of a third polycrystalline silicon layer or a metal such as aluminum, molybdenum or tungsten. The gate electrode 42 thus made is used as a mask to form a highly doped n-type layer 43 in a self-aligning manner (as shown in FIG. 9F). After that, a PSG (phosphosilicate glass) film 44 having a thickness of 0.5 to 1 μm is deposited, and a contact hole is formed. At last, an aluminum electrode 45 is formed (as shown in FIG. 9G). Here, the reason why the boron ions B+ are implanted with the high energy in the step shown in FIG. 9B is to establish the high junction capacitance. As shown in FIG. 10, more particularly, if the boron ions are implanted into the silicon with a high energy such as 300 to 400 KeV and if a heat treatment is effected at 1000° C. for about 20 minutes, the impurity concentration assumes its peak in a deep region of about 0.6 μm in the silicon, as seen from a curve 101. The junction capacitance thus established between the p+-type layer and the n+-type layer (as shown in a curve 103 of impurity concentration) is less dependent upon an applied voltage than the junction capacitance between the p+-type layer and the n+-type layer, which has its peak at the silicon surface, as shown in a curve 102, so that it can assume a high value even with the voltage application. In FIG. 11, the dependencies of the junction capacitances, as shown in the curves 101 and 102 of FIG. 10, upon the applied voltage are indicated at 111 and 112, respectively.

EXAMPLE 7

Figure 12A:
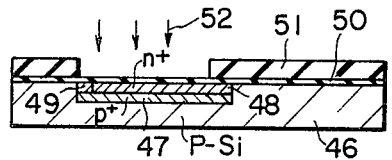
FIGS. 12A, 12B, 12C, 12D, 12E, 12F and 12G are sectional views illustrating one example of the steps for producing the memory cell of FIG. 7A.
Figure 12B:
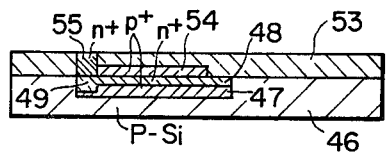
Figure 12C:
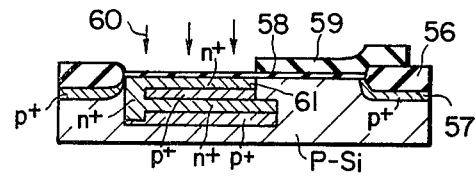
Figure 12D:
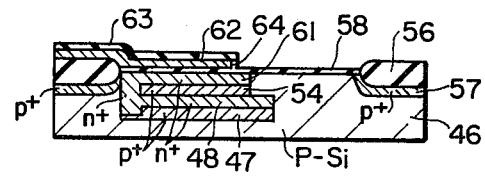
Figure 12E:
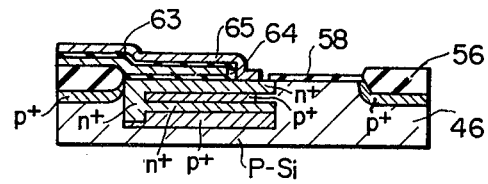
Figure 12F:
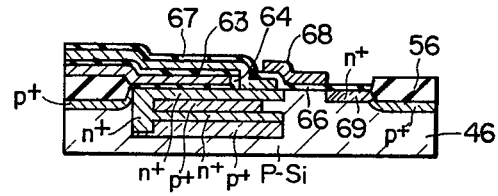
Figure 12G:
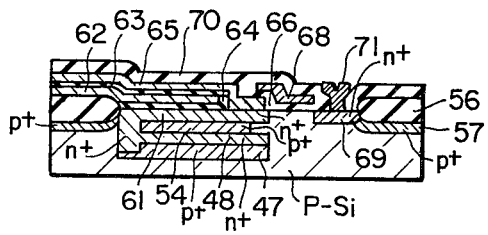

FIGS. 12A to 12G show the process for producing the memory cell which has multiple steps of n+-p+ junctions and which has the construction shown in FIG. 7A. A lowly doped p-type silicon substrate 46 has its surface formed with the n+-p+ junction by the ion-implantation process or the heat diffusion process. In this instance, a p+-type layer 47 is made of boron whereas an n+-type layer is divided into two regions, i.e., a region 48 doped with an impurity having a low diffusion coefficient such as arsenic or antimony and a region 49 doped with an impurity having a high diffusion coefficient such as phosphorus. After that, a thin oxide film (of $SiO_2$) 50 having a thickness of 10 to 50 nm is formed on the surface of the silicon substrate 46, and boron ions are implanted with a concentration of $10^{12}$ to $10^{13}$ cm$^{-2}$ into the surface of the n+-type layer 48 by using a photoresist film 51 as a mask (as shown in FIG. 12A). After the oxide film 50 and the photoresist film 51 are then removed from the surface of the silicon substrate, a p-type silicon layer of low impurity concentration 53 having a similar impurity concentration to that of the substrate is made to grow on the surface of the silicon substrate by the epitaxial growth process until it has a thickness of about 1 μm. In this instance, the boron impurity implanted into the surface of the n+-type layer 48 is also added to the p-type epitaxial grown layer thereby to form a p+-type layer 54. Moreover, the n+-type layer 49 doped with the impurity having a high diffusion coefficient such as phosphorus epitaxially grows into the p-type epitaxial grown layer thereby to form an n+-type layer 55 having a large diffusion depth (as shown in FIG. 12B). After that, a field oxide film (of $SiO_2$) 56 having a thickness of 0.5 to 1 μm and a p-type channel stopper layer 57 are formed by the local oxidization process. Then, a thin oxide film ($SiO_2$) 58 having a thickness of 20 to 50 nm is formed on the surface of the p-type epitaxial grown layer, and an n-type impurity 60 such as arsenic is ion-implanted in a concentration of $10^{13}$ to $10^{14}$ cm$^{-2}$ by using an n-type layer 61 by using a photoresist film 59 as a mask (as shown in FIG. 12C). Then, a first polycrystalline silicon layer 62 is deposited to have a thickness of 0.1 to 0.3 μm, and an insulating film 63 of high permitivity having a thickness of 20 to 50 nm such as a nitride film (of $Si_3N_4$) or an alumina film (of $Al_2O_3$) is formed thereon. After that, a thin oxide film (of $SiO_2$) 64 having a thickness of 0.3 to 0.5 μm is formed on the side of the polycrystalline silicon 62 by the oxidization process (as shown in FIG. 12D). Then, the thin oxide film (of $SiO_2$) 58 is locally removed, and a second polycrystalline silicon layer 65 highly doped with an n-type impurity is deposited to have a thickness of 0.2 to 0.3 μm (as shown in FIG. 12E). After the thin oxide film 58 is then removed, a thin gate oxide film (of $SiO_2$) 66 is again formed to have a thickness of 20 to 50 nm. On the second polycrystalline silicon layer 65, on the other hand, there is formed a thick oxide film (of $SiO_2$) 67 having a thickness of 100 to 200 nm. Then, a gate electrode 68 is formed by the third polycrystalline silicon layer or a metal such as aluminum, molybdenum or tungsten. The gate electrode 68 thus formed is used as a mask to form a highly doped n-type layer 69 in a self-aligning manner (as shown in FIG. 12F). Then, a PSG film 70 having a thickness of 0.5 to 1.0 μm is deposited, and a contact hole is formed. At last, an aluminum electrode 71 is formed (as shown in FIG. 12G).

As has been described hereinbefore, according to this invention, a dynamic memory having a high integration density and a large storage capacitance can be realized so that the MOS-RAM having a large capacitance can be stably operated.

A memory cell having a large storage capacitance can be produced with the use of the construction according to this invention. In order to raise the signal voltage, however, it is necessary to reduce the parasitic capacitance of the data line.

EXAMPLE 8

Figure 13:
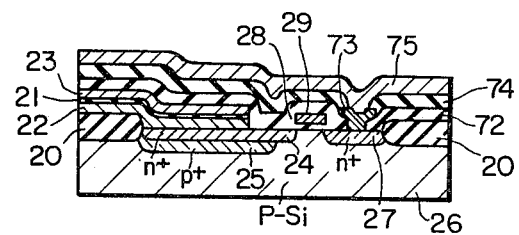
FIG. 13 is a sectional view showing the construction of a memory cell according to another embodiment of a MOS·RAM of this invention.

The construction shown in FIG. 13 is made such that a construction to reduce the capacitance of the data line is added to the construction according to this invention thus far described. In the MOS-RAM memory cell construction of FIG. 4A, after a contact hole is formed in a first PSG layer 72, it is covered with polycrystalline Si or Al 73. After that, a second PSG film layer 74 is deposited to have a thickness of 0.5 to 1.0 μm. Then, a contact hole is again opened, and the data line is made of Al 75. By the use of the construction thus far described, the PSG film below the Al wire 75 can be made as thick as twice that of the conventional construction so that the parasitic capacitance of the Al wire can be accordingly reduced to one half. As a result, the signal voltage from the memory cell can be further increased by the increase in the storage capacitance and the reduction in the capacitance of the data line.

What is claimed is:

1. A semiconductor memory comprising a memory cell disposed on a semiconductor substrate of first conduction type and including an insulated-gate field effect transistor and a storage capacitor,
   wherein the improvement resides in that said storage capacitor comprises: an insulator capacitor including a first electrode disposed on said substrate, an insulating film disposed on the first-named electrode for providing a dielectric, and a second electrode disposed on said insulating film; and a pn junction capacitor including a first impurity region of second conduction type for constituting one of the source and drain of said insulated-gate field effect transistor, and a second impurity region of first conduction type disposed in contact with the first-named impurity region and having a higher impurity concentration than said substrate.

2. A semiconductor memory as set forth in claim 1, wherein the first electrode of said insulator capacitor is disposed on the first impurity region of said pn junction capacitor.

3. A semiconductor memory as set forth in claim 2, wherein the second electrode of said insulator capacitor is set at either a ground potential or a DC bias potential.

4. A semiconductor memory as set forth in claim 1, wherein the first electrode of said insulator capacitor is disposed on the first impurity region of said pn junction capacitor through said insulating film whereas the second electrode of said insulator capacitor is connected with the first-named impurity region.

5. A semiconductor memory as set forth in claim 4, wherein the first electrode of said insulator capacitor is set at a ground potential.

6. A semiconductor memory as set forth in claim 1, wherein the insulating film for providing the dielectric of said insulator capacitor is either a silicon nitride film or a aluminum oxide film.

7. A semiconductor memory as set forth in claim 1, wherein the first and second electrodes of said insulator capacitor are constructed of a polycrystalline silicon layer.

8. A semiconductor memory as set forth in claim 7, wherein the gate electrode of said insulated-gate field effect transistor is made of polycrystalline silicon.

* * * * *